(12) United States Patent
Zelenz (10) Patent No.: US 8,022,785 B2
(45) Date of Patent: Sep. 20, 2011

(54) STEP ATTENUATOR CIRCUIT WITH IMPROVED INSERTION LOSS

(75) Inventor: Martin L Zelenz, DeWitt, NY (US)

(73) Assignee: Arcom Digital, LLC, Syracuse, NY (US)

( * ) Notice: Subject to any disclaimer, the term of this patent is extended or adjusted under 35 U.S.C. 154(b) by 109 days.

(21) Appl. No.: 12/315,379

(22) Filed: Dec. 3, 2008

(65) Prior Publication Data

US 2010/0134206 A1 Jun. 3, 2010

(51) Int. Cl.
H03H 7/01 (2006.01)
(52) U.S. Cl. .................................. 333/81 R; 333/185
(58) Field of Classification Search ................. 333/81 R, 333/81 A, 185
See application file for complete search history.

(56) References Cited

U.S. PATENT DOCUMENTS

| | | | |
|---|---|---|---|
| 5,745,838 | A | 4/1998 | Tresness et al. |
| 5,999,796 | A | 12/1999 | Tresness et al. |
| 6,349,456 | B1 | 2/2002 | Dunn et al. |
| 6,784,760 | B2 | 8/2004 | Olcen et al. |
| 7,100,277 | B2 | 9/2006 | Borland et al. |
| 2005/0001697 | A1* | 1/2005 | Gould et al. ................. 333/185 |
| 2008/0223603 | A1 | 9/2008 | Kim et al. |

OTHER PUBLICATIONS

Genesys Program Report by Agilent Technologies, Inc., Santa Clara, CA, entitled, "Interdigital Capacitor Design," available at eesof.tm.agilent.com/pdf/eagleware/apps/0009_AccuracyProofMidcap.pdf, 2004 (Copy Attached).
LPA-10A.CKT Circuit Schematic and Circuit File for 10 dB Step Attenuator (dated Feb. 6, 1996, 4:02 PM), 1 page.
LPA1001.DAT, LPA1002.DAT, LPA1011.DAT, LPA1021.DAT, LPA1031.DAT, LPA1041.DAT, LPA1042.DAT, LPA1012.DAT, LPA1022.DAT Measured Response, Input Return Loss and Group Delay Plots of the LPA-10A.CKT Circuit (dated Feb. 7, 1996), 9 pages.
LPA-20A.CKT Circuit Schematic and Circuit File for 20 dB Step Attenuator (dated Feb. 6, 1996, 3:54 PM), 1 page.
LPA2001.DAT, LPA2002.DAT, LPA2011.DAT, LPA2031.DAT, LPA2041.DAT, LPA2042, LPA2022.DAT, LPA2021. DAT, LPA2012.DAT, Measured Response, Input Return Loss and Group Delay Plots of the LPA-20A.CKT Circuit (dated Feb. 7, 1996), 9 pages.
LPA-3A.CKT Circuit Schematic and Circuit File for 30 dB Step Attenuator (dated Feb. 6, 1996, 12:22 PM), 1 page.
LPA3131.DAT, LPA3021.DAT, LPA3001.DAT, LPA3002.DAT, LPA3041.DAT, LPA3042.DAT, LPA3022.DAT, LPA3012.DAT, Measured Response, Input Return Loss and Group Delay Plots of the LPA-3A.CKT Circuit (dated Feb. 7, 1996), 8 pages.

* cited by examiner

*Primary Examiner* — Stephen E Jones
(74) *Attorney, Agent, or Firm* — Lawrence P. Trapani, Esq.

(57) ABSTRACT

A step attenuator circuit is mounted on a printed circuit board and has a highpass filter network passing high frequency signals and a lowpass filter network passing low frequency signals. The lowpass network presents a high shunt reactance to the high frequency signals. The lowpass network includes an attenuator network. The attenuator network attenuates the low frequency signals by a specified amount. Parasitic capacitance exists between the highpass network and the attenuator network, causing an amount of electrical energy from the high frequency signals to be absorbed by the attenuator network. A first capacitive circuit is used to compensate for parasitic capacitance. The first compensation circuit is connected across the attenuator network and is coupled to the parasitic capacitance. Consequently, the amount of electrical energy from the high frequency signals absorbed by the attenuator network is reduced, and, as a result, the insertion loss of the step attenuator is reduced.

24 Claims, 6 Drawing Sheets

STEP ATTENUATOR CIRCUIT WITH IMPROVED INSERTION LOSS

BACKGROUND OF THE INVENTION

The present invention relates generally to electronic filters for processing communication signals, and more particularly to an electronic filter called a step attenuator and a circuit modification for improving the insertion loss of the step attenuator.

A step attenuator is a filter used primarily (but not exclusively) in a bi-directional cable television (or CATV) network. The step attenuator is also bi-directional. It processes signals transmitted from a headend to a subscriber's home (i.e., "forward path") and also processes signals transmitted from the subscriber's home to the headend (i.e., "return path"). Usually, the forward path signals are transmitted in a higher frequency band than the return path signals. In the United States, for example, the forward path frequency band is 54-1000 MHz and the return path band is 5-42 MHz. A step attenuator is usually installed in the CATV network at a subscriber tap port, just upstream of the subscriber drop cable. Step attenuators are used to equalize signal levels in the return path (and, at the same, time reduce ingress) by introducing graduated amounts (i.e., steps) of attenuation at different points in the CATV network. Step attenuators attenuate signals in the return path by a specified amount, while not disturbing the forward path. A step attenuator (and its operation) are further described in U.S. Pat. No. 5,745,838.

Figure 1:
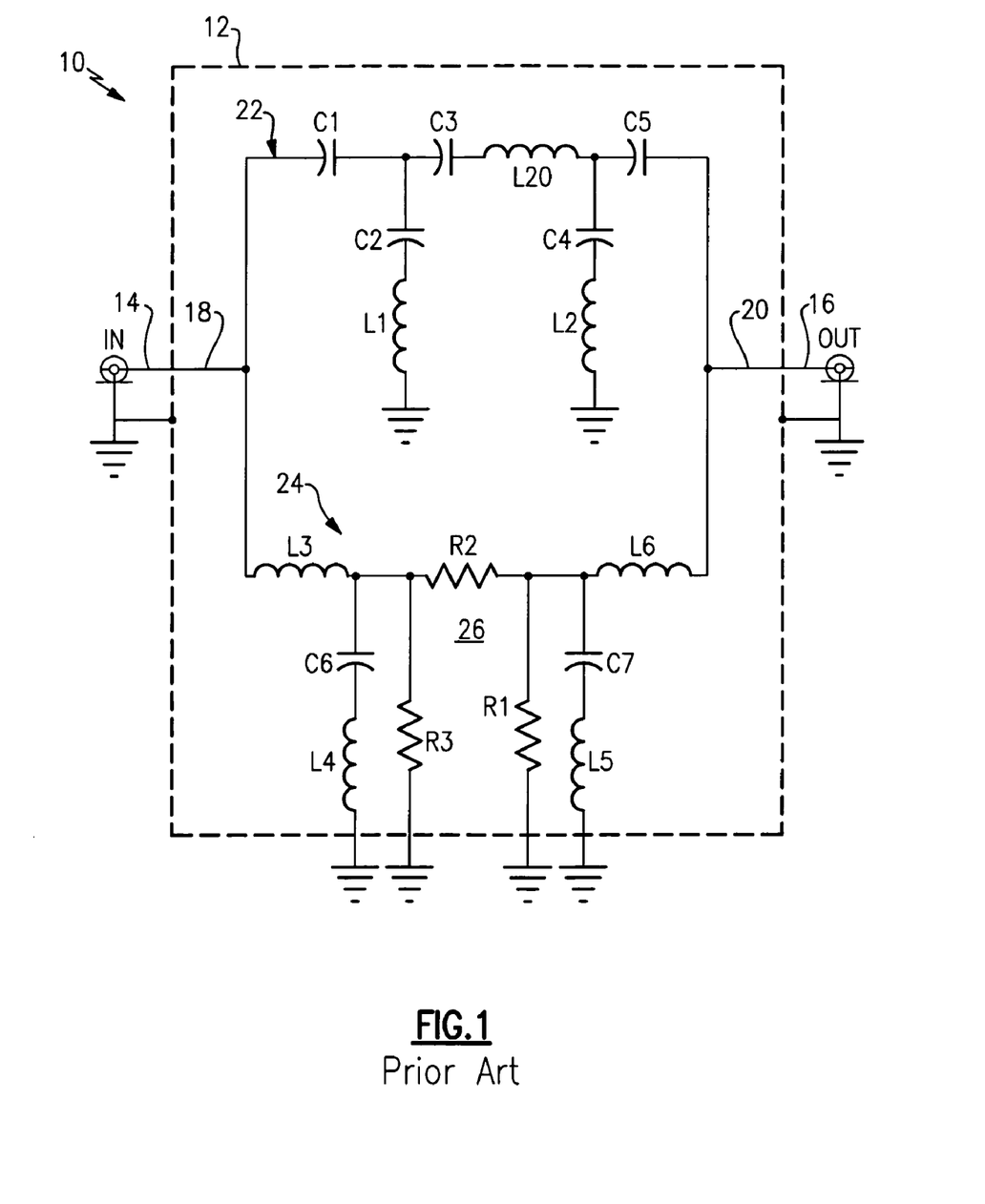
FIG. 1 is a schematic of a prior art step attenuator circuit.

In FIG. 1 herein, a schematic of a prior art step attenuator circuit is shown. A step attenuator 10 includes a housing 12, an input connector 14, an output connector 16, an input conductor 18, and an output conductor 20. Step attenuator 10 includes a highpass filter network 22 connected in parallel with a lowpass filter network 24. Lowpass network 24 includes a resistive attenuator network 26. Highpass network 22 is configured to pass high frequency signals (i.e., in the forward path frequency band) and suppress low frequency signals (i.e., signals in the return path frequency band). Lowpass network 24 is configured to pass the low frequency signals and suppress the high frequency signals. Attenuator network 26 is configured to attenuate the low frequency signals by a specified amount as the signals pass through lowpass network 24. The low frequency signals are attenuated by network 26 independently of the high frequency signals.

Prior art step attenuator 10 has functioned very well in its intended environment for over ten years. In recent years, the high frequency (or forward path) spectrum of CATV networks has been extended. It now extends to 1000 MHz, and is anticipated to go even higher, possibly up to 3000 MHz. As signal frequencies approach 1000 MHz and higher, the parasitic capacitance in a step attenuator circuit begins to adversely affect performance. In particular, the parasitic capacitance between highpass network 22 and attenuator network 26 causes leakage of high frequency signal currents (or "leakage currents") from network 22 to network 26 where the power or energy of the leakage currents is absorbed (i.e., lost) in the resistive or lossy elements of network 26 (i.e., $I^2R$ loss). These leakage currents establish high frequency voltages across R3 and R1 (FIG. 1). This lost power manifests itself in the form of a higher insertion loss for the step attenuator, and is particularly noticeable at ultra high frequencies (UHF) above 750 MHz.

Lowpass network 24 is implemented as an elliptic-function lowpass filter, as indicated by the characteristic inductor/capacitor shunt branches, C6/L4 and C7/L5 in FIG. 1. In an elliptic-function filter, inductors in the shunt branches (L4 & L5) present a high shunt reactance to any of the high frequency signals that reach them. The leakage currents of the high frequency signals (from highpass network 22) will be substantially reflected by the L/C shunt branches (and also by series inductors L3 & L6) in lowpass network 124, and will thus flow through resistors R1-R3 of attenuator network 26 (FIG. 1). This concentration of leakage currents in network 26 provides a worse case for the $I^2R$ power loss of the high frequency signals. Thus, an elliptic-function implementation of lowpass network 24 is less than ideal in a step attenuator circuit, if the only goal is to minimize the adverse effects of parasitic capacitance. However, an elliptic-function lowpass network is usually chosen for a step attenuator, because it provides a sharper transition region than most implementations for a given number of electrical components used (i.e., it is an efficient design) and it provides a relatively flat passband response while still achieving a good transition region (usually a tradeoff). Thus, rather than switch to an implementation that has only a capacitor or capacitors in the shunt branch (providing a lower reactance to the high frequency signals), e.g., as shown in FIG. 1 of U.S. Pat. No. 6,784,760, it would be more desirable to find another solution to minimize the effects of parasitic capacitance.

Figure 2:
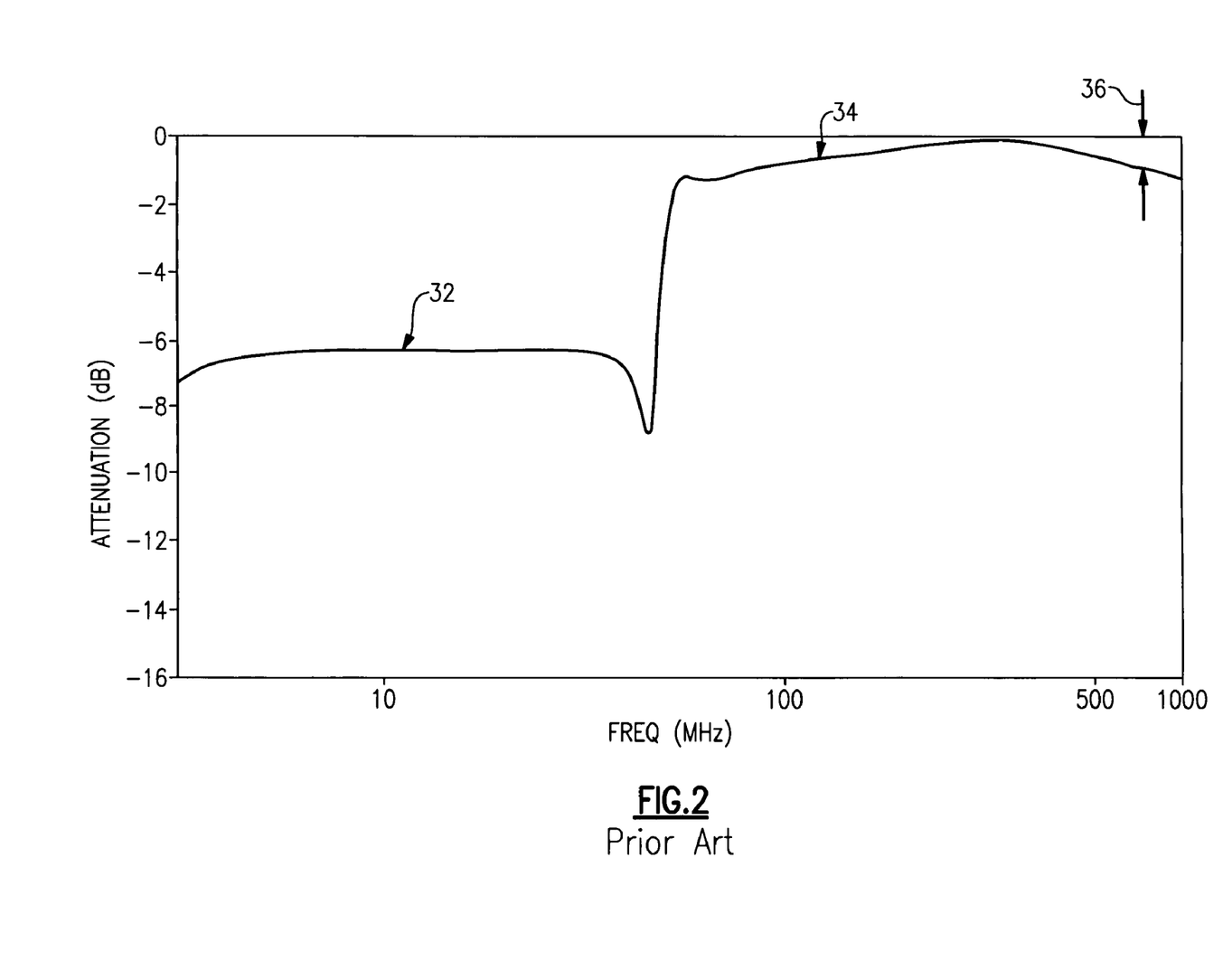
FIG. 2 is a frequency response plot of a prior art step attenuator circuit, showing uncompensated insertion loss at high frequencies.

FIG. 2 is a simulated plot of the frequency response for step attenuator 10. As shown, a low frequency response 32 (i.e., 5-42 MHz) is attenuated about 6 dB by attenuator network 26. A high frequency response 34 (i.e., 54-1000 MHz) exhibits little attenuation over a broad range of frequencies, but a noticeable amount of insertion loss 36 (or attenuation) appears above 750 MHz. As explained above, insertion loss 36 is caused (at least in significant part) by the parasitic capacitance between highpass network 22 and attenuator network 26. Heretofore, insertion loss 36 has been tolerable. However, as television service extends to 1000 MHz and above, insertion loss 36 becomes less and less tolerable, especially when additional equipment is being used in the subscriber's home (which is becoming more and more the case). A solution to correct or improve (i.e., reduce) the insertion loss is needed.

Known techniques to minimize parasitic capacitance in high frequency circuits have included (1) careful layout of circuit components and traces on the printed circuit board (PCB), (2) ample separation of the components and traces, and (3) the use of shielding, ground planes, and/or terminations where possible. Certainly, the technique of carefully laying out components and traces has been employed with success in step attenuators and like filters. However, as shown in FIG. 2, a noticeable amount of insertion loss (36) still remains at the ultra high frequencies above 750 MHz. Step attenuators are designed to be very small and compact so that they can be conveniently installed at the subscriber tap ports. Thus, there is little room for separating circuit components and board traces in current step attenuator packages.

To achieve compact size, step attenuator circuits are usually mounted on both sides of a small circuit board. If metal shields are used to minimize parasitic capacitance, all of the circuit components may need to be relocated to one side of the circuit board, thus requiring a significantly larger board. Thus, the shielding technique may not be an optimum solution, and would likely add to the cost of manufacturer. Step attenuators need to be low cost devices, because a great number of them are usually deployed throughout a communication network. The use of ground planes (e.g., sandwiched between layers of printed circuit board) to reduce parasitic capacitance may also add to the cost and complexity of manufacture and produce unintended stray capacitance, resulting in frequency response roll-off. Thus, a more optimum solution to reduce the effects of parasitic capacitance is needed.

OBJECTS AND SUMMARY OF THE INVENTION

It is therefore an object of the present invention to provide a step attenuator circuit that overcomes the problems and drawbacks associated with the prior art.

It is another object of the present invention to provide a step attenuator circuit that reduces the adverse effects of parasitic capacitance at high frequencies.

It is a further object of the present invention to provide a step attenuator that has improved insertion loss performance at high frequencies.

It is still another object of the present invention to improve the insertion loss performance of a step attenuator without significantly changing the circuit design and circuit board layout of the step attenuator.

It is still a further object of the present invention to improve the insertion loss performance of a step attenuator without increasing the size of the step attenuator or significantly increasing the cost of manufacture.

These and other objects are attained in accordance with the present invention, wherein there is provided a step attenuator circuit, mounted on a printed circuit board, of the type in which a highpass filter network passes high frequency signals and a lowpass filter network passes low frequency signals. The lowpass network is of the type that presents a high shunt reactance to the high frequency signals. The lowpass network includes an attenuator network having input and output nodes. The attenuator network attenuates the low frequency signals by a specified amount. Parasitic capacitance exists between the highpass network and the attenuator network, causing an amount of electrical energy from the high frequency signals to be absorbed by the attenuator network. A first capacitive circuit is used to compensate for parasitic capacitance. The first capacitive circuit is connected across the attenuator network between either the input or the output node and ground, and is coupled to the parasitic capacitance. Consequently, the amount of electrical energy from the high frequency signals absorbed by the attenuator network is reduced, and, as a result, the insertion loss of the step attenuator is reduced.

In the preferred embodiment, a second capacitive circuit is also used to compensate for parasitic capacitance. The second capacitive circuit is also connected across the attenuator network and presents a low shunt reactance to the high frequency signals. In this embodiment, the first capacitive circuit is connected between the input node of the attenuator network and ground, and the second capacitive circuit is connected between the output node of the attenuator network and ground. Like the first capacitive circuit, the second capacitive circuit is coupled to the parasitic capacitance, causing a further reduction in the amount of electrical energy from the high frequency signals absorbed by the attenuator network. This results in a further reduction of the insertion loss.

In the preferred embodiment, the capacitance value of each of the first and second capacitive circuits should be at least equal to the effective value of the parasitic capacitance between the highpass network and the input and output nodes, respectively. More specifically, a value of about 3 to 4 times the effective parasitic capacitance value (between the highpass network and input or output node) appears to provide ample improvement in the insertion loss performance. A preferred range of capacitance values for the first and second capacitive circuits is approximately from 1 to 25 times the effective parasitic capacitance (between the highpass network and input or output node). A practical range of capacitance values may be from about 0.5 pF to about 11 pF, but the present invention is not limited to this range.

In the preferred embodiment, first and second capacitive circuits each consists of a single capacitor, because the use of one capacitor is usually sufficient, requires the least amount of area on a printed circuit board, and minimizes cost.

BRIEF DESCRIPTION OF THE DRAWING

Further objects of the present invention will become apparent from the following description of the preferred embodiment with reference to the accompanying drawing, in which.

DETAILED DESCRIPTION OF THE PREFERRED EMBODIMENT

Figure 3:
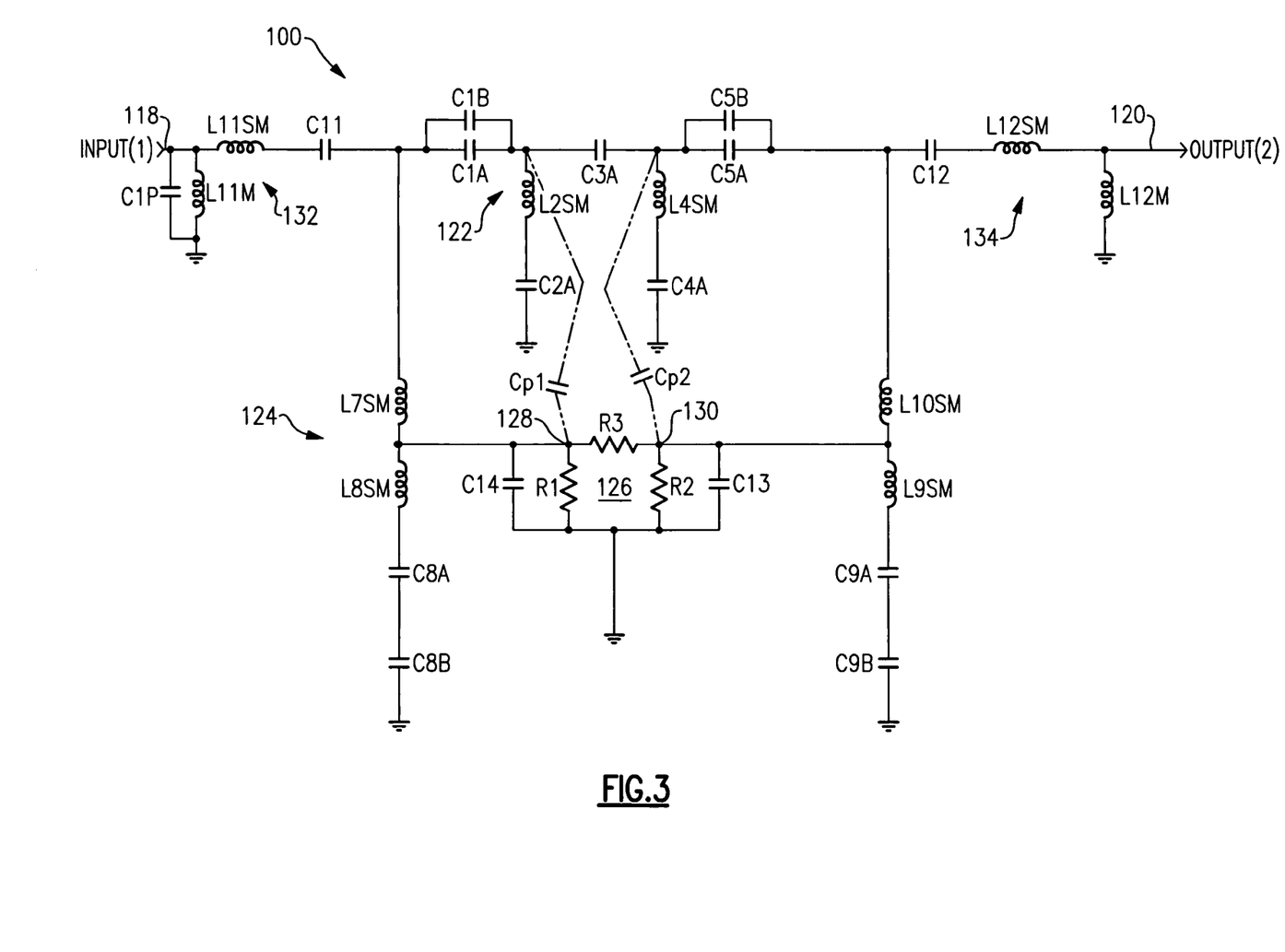
FIG. 3 is a schematic of a preferred embodiment of a step attenuator circuit constructed in accordance with the present invention, showing a highpass filter network, a lowpass filter network, and an attenuator network as part of the lowpass filter network.

FIG. 3 shows a schematic diagram of a preferred embodiment of a step attenuator circuit 100, constructed in accordance with the present invention. Circuit 100 comprises an input line 118, an output line 120, a highpass filter network 122, a lowpass filter network 124, and an attenuator network 126 forming part of lowpass network 124. Highpass network 122 is an elliptic-function filter, consisting of: capacitors C1B, C1A, C2A, C3A, C4A, C5A, and C5B; and inductors L2SM and L4SM. Lowpass network 124 is an elliptic-function filter, consisting of: inductors L7SM, L8SM, L9SM, and L10SM; capacitors C8A, C8B, C9A, and C9B; and attenuator network 126. In this preferred embodiment, attenuator network 126 is a resistive Pi network, consisting of resistors R1, R2 and R3. Attenuator network 126 has an input node 128 and an output node 130.

The values of the capacitors and inductors of highpass network 122 are determined so that network 122 passes high frequency signals from 54-1000 MHz (i.e., the forward path frequency band) and suppresses low frequency signals from 5-42 MHz (i.e., the return path frequency band). The values of the capacitors and inductors of lowpass network 124 are determined so that network 124 passes the low frequency signals from 5-42 MHz and suppresses the high frequency signals from 54-1000 MHz. Finally, the values of resistors R1-R3 of attenuator network 126 are determined so that network 126 attenuates the low frequency signals by a specified amount as those signals pass through lowpass network 124. Typical attenuation amounts are 6, 12 and 18 dB. The values of the components for highpass network 122 and lowpass network 124 (including network 126) can be determined by well-known filter synthesis techniques and/or filter design software, such as the GENESYS program from Agilent Technologies, Inc., Santa Clara, Calif. Further details of the design and operation of a step attenuator are described in U.S. Pat. No. 5,745,838, which is incorporated herein by reference.

Lowpass filter network 124 is implemented as an ellipticfunction lowpass filter, as indicated by the characteristic inductor/capacitor shunt branches, L8SM/C8A/C8B and L9SM/C9A/C9B (FIG. 3). Branches L8SM/C8A/C8B and L9SM/C9A/C9B present a high shunt reactance to high frequency signals, because of the inductive reactance produced by inductors L8SM and L9SM. Thus, the high frequency signal currents that leak from highpass network 122 to lowpass network 124 will be substantially reflected by L8SM and L9SM (and also by series inductors L7SM & L10SM). All of the leakage signal currents will thus flow through resistors R1-R3 of attenuator network 126 (FIG. 3) if no compensation is provided. Thus, an elliptic-function implementation of lowpass network 124, or any other implementation employing inductor/capacitor shunt branches, will require some compensation to improve the insertion loss performance at high frequencies, particularly above 750 MHz. In the preferred embodiment of the present invention, such compensation is provided by capacitors C13 and C14 (FIG. 3). Note that the present invention, as claimed, is not limited to an ellipticfunction implementation for the lowpass filter network; the invention applies to any lowpass filter implementation employing inductor/capacitor shunt branches.

Again referring to FIG. 3, step attenuator circuit 100 includes an input circuit 132 and an output circuit 134. Input circuit 132 includes a capacitor C1P in parallel with a molded inductor L11M, a surface mount inductor L11SM, and a blocking capacitor C11. Capacitor C1P is a very small capacitance (e.g., 0.75 pF) and is in circuit 100 to balance the inherent capacitance of a female collet connector associated with output line 120 (on the other end of circuit 100). Circuit 100 is intended to be enclosed in a housing (not shown) having a male connector coupled to input line 118 and a female collet connector coupled to output line 120 (see, e.g., FIGS. 8 & 10 in U.S. Pat. No. 5,745,838). The structure of the female collet connector produces a small capacitance, and the value of C1P is selected to approximate that small capacitance. Inductor L11M has a large inductance value (e.g., 3.9 µH) so that it will shunt to ground (or suppress) power or other low frequency (e.g., 100 KHz) surges, without interfering with the overall performance of circuit 100. Inductor L11SM is a very small inductance (e.g., <10 nH), which is used for impedance matching to a 75 ohm system, to achieve good return loss. Capacitor C11 is primarily a blocking capacitor, having a value of approximately 1000 pF. It allows signals above about 5 MHz to pass. It also aids in impedance matching to achieve good return loss. Output circuit 134 includes a capacitor C12, a surface mount inductor L12SM, and a molded inductor L12M. Capacitor C12 has the same value as C11 and performs the same functions. Inductor L12SM is a very small inductance and performs the same function as L11SM. Inductor L12M performs the same surge suppression function as inductor L11M.

In actual implementation, step attenuator circuit 100 is mounted on a printed circuit board (FIGS. 5A & 5B), and will, invariably, be influenced by parasitic capacitance distributed over highpass network 122. As signal frequencies approach 1000 MHz and higher, the parasitic capacitance will begin to adversely affect the performance of circuit 100. The parasitic capacitance causes leakage of high frequency signal currents ("leakage currents") from network 122 to attenuator network 126, where the power or energy of the leakage currents is absorbed (i.e., lost) in resistors R1-R3 (i.e., $I^2R$ loss). These leakage currents establish high frequency voltages across R1 and R2 (FIG. 3). This lost power manifests itself in the form of a progressively higher (with frequency) insertion loss in circuit 100, which is particularly noticeable at ultra high frequencies above 750 MHz (see FIG. 2).

In FIG. 3, the parasitic capacitance is represented symbolically (in phantom lines) as discrete capacitors, Cp1 and Cp2, between highpass network 122 and attenuator network 126. In circuit 100, the effective parasitic capacitance CP1 between highpass network 122 and input node 128 is estimated to be about 0.55 pF. And, the effective parasitic capacitance CP2 between highpass network 122 and output node 130 is estimated to be about 0.55 pF. In a symmetrically laid out circuit, it is expected that parasitic capacitances CP1 and CP2 would be about equal.

The above-described adverse effects of parasitic capacitance are minimized in the preferred embodiment by connecting compensation capacitors C13 and C14 (FIG. 3) across attenuator network 126. Capacitor C14 is connected between input node 128 and ground and capacitor C13 is connected between output node 130 and ground. Capacitors C14 and C13 are coupled to the effective parasitic capacitances CP1 and CP2, respectively. Capacitors C14 and C13 reduce the high frequency voltage drop (due to leakage currents) across resistors R1 and R2, respectively ("leakage voltage drop"). Thus, the amount of high frequency power ("leakage power") lost in R1 or R2 (i.e., $I^2R$ loss) is reduced. The leakage voltage drop is reduced across R1 and R2, because C14 and C13 draw leakage currents away from R1 and R2, respectively. This results in a reduction of the insertion loss in step attenuator circuit 100 at high frequencies.

Alternatively, the reduction in leakage power lost in R1 and R2 can be understood by considering capacitor C14 and parasitic capacitance CP1 (or capacitor C13 and parasitic capacitance CP2) as effectively forming a capacitive voltage divider. The equation for a capacitive voltage divider is, e.g., $V_R=V_p(CP1/(CP1+C14))$, where $V_R$ is the voltage drop across resistor R1 and $V_p$ is the voltage drop across the entire divider circuit (i.e., CP1 & C14). It can be seen from this equation that the presence of capacitor C14 would reduce the leakage voltage drop across resistor R1. As capacitor C14 is increased in value, the leakage voltage drop across resistor R1 would be expected to decrease. However, if the value of capacitor C14 (or C13) is increased too much, it will begin to adversely affect the frequency response of lowpass network 124 and possibly cause perturbations (or "suck outs") in the high frequency response of highpass network 122.

It has been empirically determined that the value of capacitors C14 and C13 should be at least equal to the value of the parasitic capacitances Cp1 and Cp2, respectively, to achieve approximately a 50% reduction in the insertion loss at 1000 MHz. More specifically, a value for C14 and C13 of about 3 to 4 times the value of parasitic capacitances Cp1 and Cp2, respectively, appears to provide ample improvement in the insertion loss performance. A preferred (but not limiting) range of capacitance values for C14 and C13 is approximately from 1 to 25 times the value of parasitic capacitances Cp1 and Cp2, respectively. A practical range of actual capacitance values for C14 and C13 may be from about 0.5 pF to about 11 pF, for typical implementations of step attenuator circuit 100. It should be noted that the present invention is not limited to the above-mentioned capacitance values or range of values.

The present invention is not limited to using a single capacitor (such as C14 or C13) at nodes 128 and 130, to compensate for the adverse effects of parasitic capacitance. C14 and C13 can be replaced by any suitable capacitive circuit, which may include more than one capacitor, or include additional components other than capacitors, as long as capacitance is the dominant property of the capacitive circuit. It is preferred, however, that each capacitive circuit be a single capacitor (e.g., C14 or C13), because the use of one capacitor is usually sufficient, requires the least amount of area on a printed circuit board, and minimizes cost. In the event that more than one capacitor is used as a capacitive circuit, the capacitance values and ranges mentioned in the previous paragraph would apply to the combined capacitance of the capacitive circuit.

Figure 4:
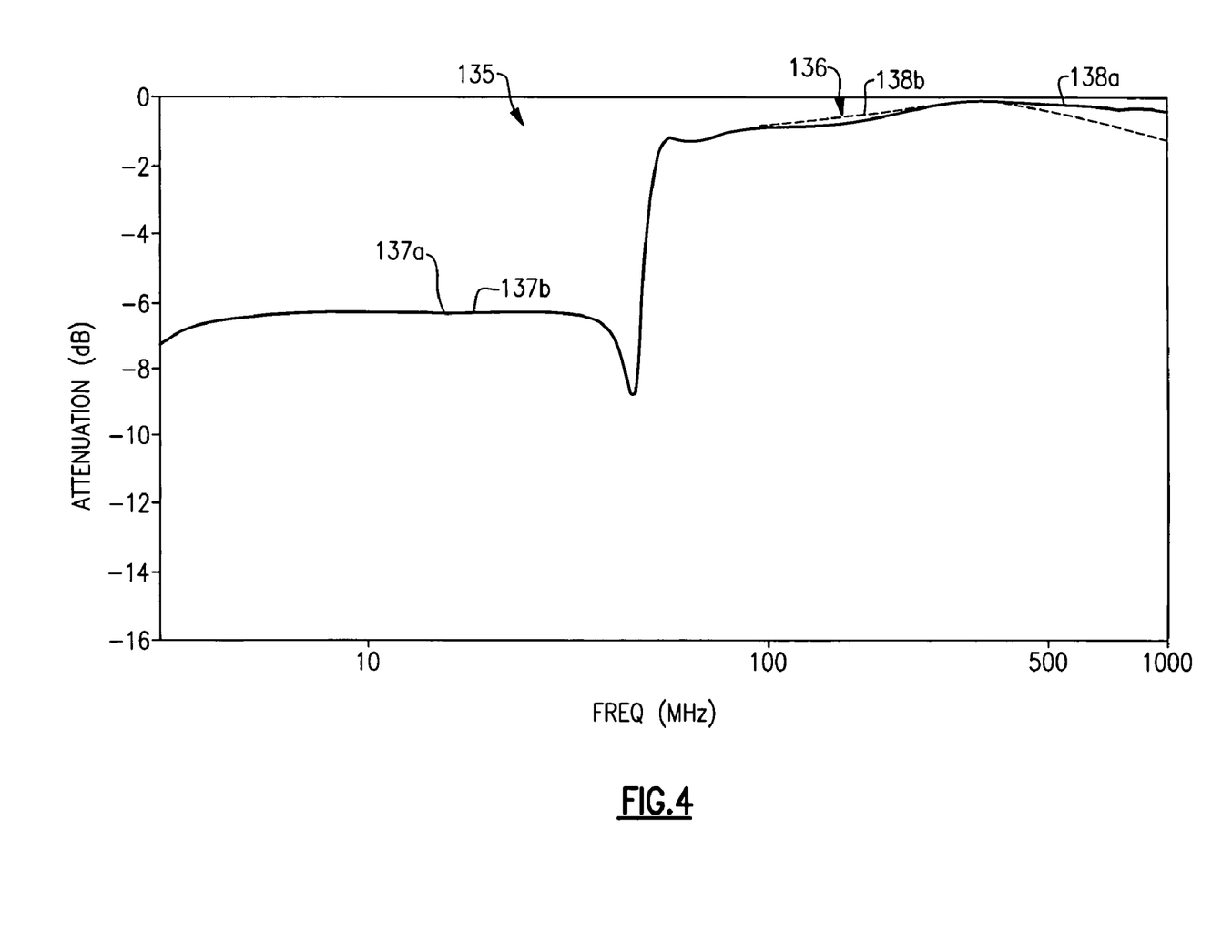
FIG. 4 is a frequency response plot of the step attenuator circuit of FIG. 3, showing compensated (solid line) and uncompensated (phantom line) insertion loss at high frequencies.

FIG. 4 shows a simulated frequency response plot 135 for step attenuator circuit 100 (solid line), superimposed over a simulated response plot 136 of circuit 100 without compensating capacitors C14 and C13 (dotted line) ("circuit 100'"). Plots 135 and 136 have low frequency responses 137a and 137b, respectively (i.e., 5-42 MHz), and high frequency responses 138a and 138b, respectively (i.e., 54-1000 MHz). Low frequency responses 137a and 137b are attenuated by about 6 dB relative to high frequency responses 138a and 138b, because of attenuator network 126 (which is configured in this example to produce 6 dB of attenuation. At frequencies above 750 MHz, there is a noticeable amount of insertion loss (or attenuation) in circuit 100', while the insertion loss of circuit 100 (above 750 MHz) is noticeably reduced relative to circuit 100'. At 1000 MHz, the insertion loss of circuit 100' is about 1.2 dB and circuit 100 is about 0.35 dB. This improvement in insertion loss is significant at this frequency, in light of the more stringent specifications contemplated for CATV. In this simulation, the capacitance values of compensation capacitors C14 and C13 (of circuit 100) was 1.8 pF, a little over 3 times the estimated parasitic capacitance (0.55 pF) between highpass network 122 and attenuator network 126.

Figure 5A:
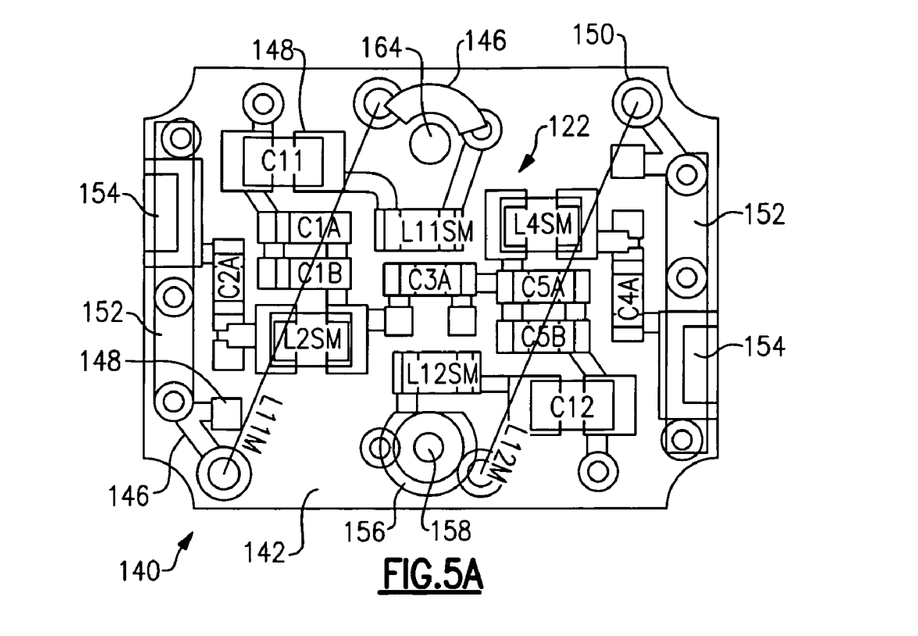
FIG. 5A is a top plan view of a printed circuit board on which are mounted electrical components of the highpass network of the step attenuator circuit of FIG. 3.
Figure 5B:
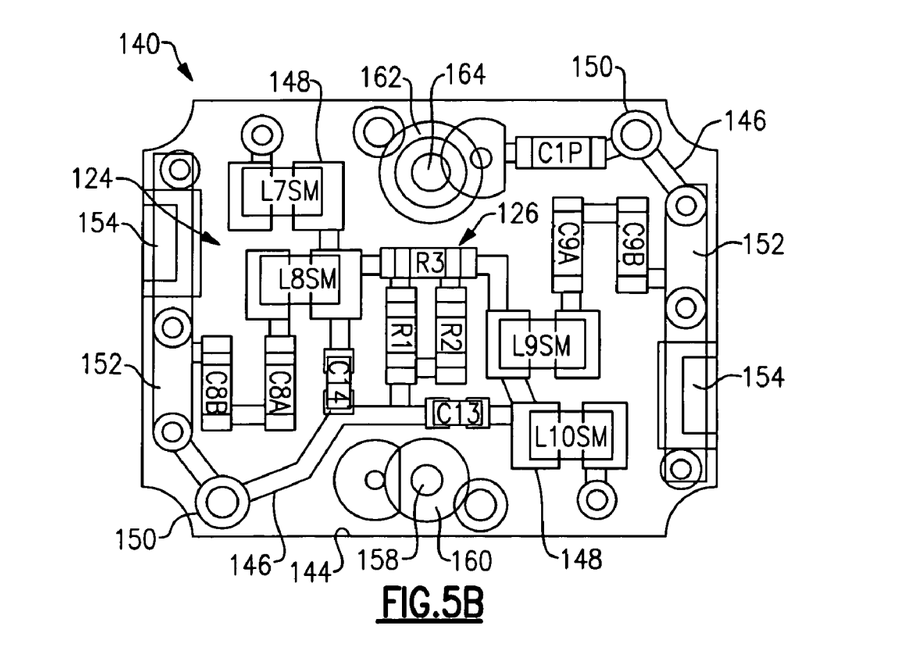
FIG. 5B is a bottom plan view of the printed circuit board on which are mounted electrical components of the lowpass network of the step attenuator circuit of FIG. 3.

FIGS. 5A and 5B illustrate a printed circuit board 140 on which step attenuator circuit 100 is mounted. FIG. 5A is a top view of board 140 and FIG. 5B is a bottom view of board 140. Board 140 is of a conventional printed circuit board construction, made of, e.g., FR4 fiberglass with copper plating on each side of the board. Board 140 has a top mounting surface 142 (FIG. 5A) and a bottom mounting surface 144 (FIG. 5B). In its finished state, board 140 contains etched copper traces 146, etched copper pads 148, and plated through holes 150. Copper ground strips 152 and grounding pads 154 are etched on the left and right ends (as viewed in FIGS. 5A & 5B) of top and bottom surfaces 142/144 of board 140. Grounding pads 154 are to be soldered to a metal filter housing (enclosing board 140) to establish a common ground for the circuitry mounted on board 140.

Top surface 142 of board 140 (FIG. 5A) also includes a circular copper pad 156 containing a hole 158 which extends through the board for receiving the mounting end of a female collet conductor (i.e., the conductor that extends through the female or output connector). Bottom surface 144 (FIG. 5B) includes a circular pad 160 in registration with pad 156. The mounting end of the collet conductor is soldered to pads 156 and 160. Bottom surface 144 of board 140 (FIG. 5B) includes a circular copper pad 162 containing a hole 164 which extends through the board for receiving the mounting end of a male pin conductor (i.e., the conductor that extends through the male or input connector). The mounting end of the male pin is to be soldered to pad 162.

As shown in FIG. 5A, highpass filter network 122 (comprising capacitors C1A, C1B, C2A, C3A, C4A, C5A, & C5B, and inductors L2SM & L4SM) is mounted on top surface 142. As understood from FIG. 5A, the capacitors and inductors of network 122 are surface mount components, soldered to pads 148 and connected together by traces 146. With the exception of capacitor C1P, input circuit 132 (comprising L11M, L11SM & C11) is mounted on top surface 142. Inductor L11SM and capacitor CL11 are surface components, soldered to pads 148. Inductor L11M is a molded inductor, soldered to plated through holes 150. Capacitor C1P is mounted on bottom surface 144, as shown in FIG. 5B. Output circuit 134 (comprising L12M, L12SM and C12) are mounted on top surface 142. Inductor L12SM and capacitor C12 are surface mount components, mounted to pads 148. Inductor L12M is a molded inductor, mounted to plated through holes 150.

As shown in FIG. 5B, lowpass filter network 124 (comprising inductors L7SM, L8SM, L9SM, & L10SM, capacitors C8A, C8B, C9A, & C9B, and resistors R1, R2 & R3) is mounted on bottom surface 144. The capacitors, inductors and resistors of network 124 are surface mount components, soldered to pads 148 and connected together by traces 146. Attenuator network 126 (R1-R3) is approximately at the center of lowpass network 124. Compensation capacitors C14 and C13 are also mounted on bottom surface 144, adjacent attenuator network 126.

By superimposing FIG. 5A over FIG. 5B, one can see that the high frequency path of highpass network 122 (i.e., C1A, C1B, C3A, C5A & C5B) crosses over attenuator network 126. Thus, the path of the parasitic capacitance (and leakage currents) from highpass network 122 to attenuator network 126 may be through board 140.

Capacitors C14 and C13 are preferably surface mount devices (i.e., surface mount capacitors). Alternatively, C14 and C13 can be implemented as printed circuit capacitors, such as, for example, a printed capacitor, a short break in a board trace, two parallel traces, two conductive pads in close proximity, or a microstrip interdigital capacitor (MIDCAP). As another alternative, C14 and C13 can be implemented as an integral or embedded capacitor, such as, e.g., disclosed in U.S. Pat. Nos. 7,100,277 & 6,349,456, and Pat. App. Publication US 2008/0223603.

Figure 6:
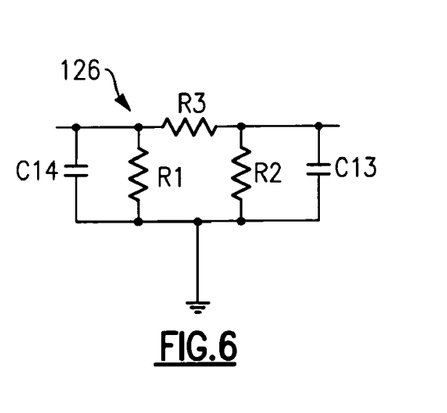
FIG. 6 is a schematic of the improved portion of the step attenuator circuit of FIG. 3, shown connected to the attenuator network.
Figure 7:
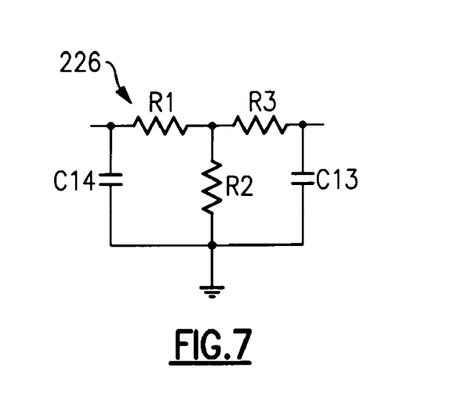
FIG. 7 is a schematic of the improved portion, shown connected to a second embodiment of the attenuator network.
Figure 8:
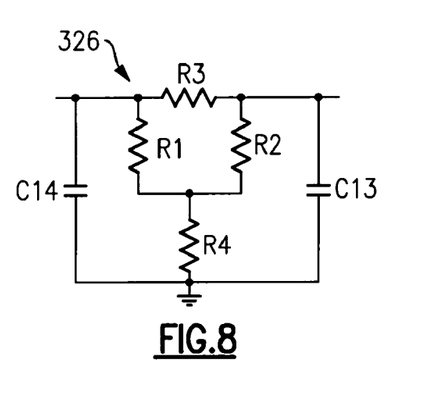
FIG. 8 is a schematic of the improved portion, shown connected to a third embodiment of the attenuator network.
Figure 9:
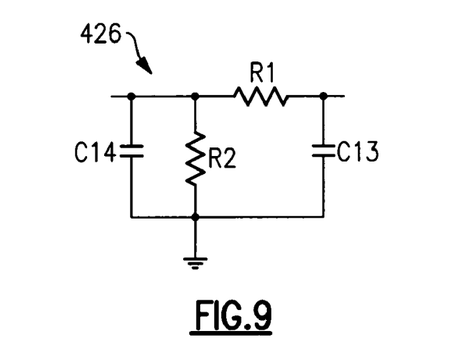
FIG. 9 is a schematic of the improved portion, shown connected to a fourth embodiment of the attenuator network.
Figure 10:
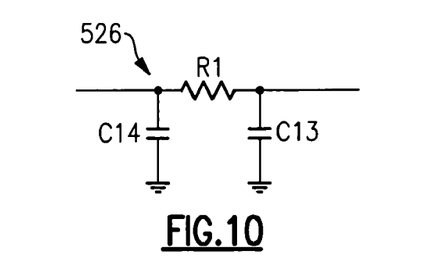
FIG. 10 is a schematic of the improved portion, shown connected to a fifth embodiment of the attenuator network.

FIG. 6 is a schematic of the improved portion of step attenuator circuit 100, showing attenuator network 126 and compensating capacitors C14 and C13. As previously indicated, attenuator network 126 (a preferred embodiment) is a Pi network of resistors R1, R2 and R3. The present invention is not limited to any particular form of attenuator network. For example, FIG. 7 is a schematic of an attenuator network 226, which is in the form of a "T" network of resistors R1, R2 and R3. FIG. 7 illustrates the preferred way of connecting compensation capacitors C14 and C13 to the T network. FIG. 8 is a schematic of an attenuator network 326, which is in the form of a bridged-T network of resistors R1, R2, R3 and R4. FIG. 8 illustrates the preferred way of connecting compensation capacitors C14 and C13 to the bridged-T network. FIG. 9 is a schematic of an attenuator network 426, which is in the form of an "L" network of resistors R1 and R2. FIG. 9 illustrates the preferred way of connecting compensation capacitors C14 and C13 to the L network. FIG. 10 is a schematic of an attenuator network 526, which is a series resistor R1. FIG. 10 illustrates the preferred way of connecting compensation capacitors C14 and C13 to network 526.

The present invention is not limited to step attenuator implementations where the attenuator network consists of resistors. The attenuator network may be implemented using ferrite chokes or ferrite chip beads in place of resistors, or using a combination of resistors and ferrite chokes or ferrite beads. Ferrite Chokes or ferrite beads are readily available from sources such as Murata Manufacturing Company, Ltd., Kyoto, Japan, and Steward, Inc. (a/k/a Laird Technologies), Chattanooga, Tenn. The use of ferrite chokes to implement an attenuator network in a step attenuator circuit is also described in U.S. Pat. No. 6,784,760. The capacitive circuits (e.g., compensating capacitors C14 & C13) of the present invention would be connected to ferrite choke or ferrite chip bead attenuator networks in the same way as illustrated in FIGS. 6-10.

While the preferred embodiments of the invention have been particularly described in the specification and illustrated in the drawing, it should be understood that the invention is not so limited. Many modifications, equivalents and adaptations of the invention will become apparent to those skilled in the art without departing from the spirit and scope of the invention, as defined in the appended claims.

What is claimed is:

1. A step attenuator having a reduced insertion loss at high frequencies, comprising:
   a printed circuit board having first and second mounting surfaces;
   a highpass filter network, including a high frequency circuit path mounted on the first surface of said printed circuit board and passing high frequency signals;
   a lowpass filter network, including an attenuator network mounted on the second surface of said printed circuit board and having input and output nodes, said lowpass filter network having a frequency response and presenting a high inductive reactance to high frequency signals at the input and the output nodes of the attenuator network;
   a parasitic capacitance through the printed circuit board, between the high frequency circuit path of said highpass filter network and the input and output nodes of the attenuator network, causing high frequency signals from the high frequency path to leak to the attenuator network; and
   a capacitive circuit, connected across the attenuator network between either the input or the output node and ground, consisting essentially of one or more capacitors and having a low reactance to the leaked high frequency signals, said capacitive circuit having a capacitance value that does not substantially affect the frequency response of said lowpass filter network, said capacitive circuit being coupled to said parasitic capacitance to draw at least some of the leaked signals away from the attenuator network and to substantially prevent their energy from being absorbed in the attenuator network,
   whereby a reduction of the insertion loss of said step attenuator at high frequencies is achieved.

2. The step attenuator of claim 1, wherein said capacitive circuit consists of a single capacitor.

3. The step attenuator of claim 1, wherein said lowpass filter network is an elliptic function filter.

4. The step attenuator of claim 1, wherein said capacitive circuit consists of a single surface mount capacitor mounted on the second surface of said printed circuit board and connected across the attenuator network between either the input or the output node and ground.

5. The step attenuator of claim 1, wherein said capacitive circuit consists of a single capacitor, the single capacitor having a capacitance value in the range of about 0.5 pF to about 11 pF.

6. The step attenuator of claim 1, wherein said capacitive circuit has a capacitance value in the range of about 0.5 pF to about 11 pF.

7. The step attenuator of claim 1, wherein the attenuator network includes at least one resistor.

8. The step attenuator of claim 1, wherein said parasitic capacitance has a capacitance value defined between the high frequency path of said highpass filter network and either the input or the output node of the attenuator network, and wherein said capacitive circuit has a capacitance value of approximately 3 to 4 times the capacitance value of said parasitic capacitance.

9. The step attenuator of claim 1, wherein said parasitic capacitance has a capacitance value defined between the high frequency path of said highpass filter network and either the input or the output node of the attenuator network, and wherein said capacitive circuit has a capacitance value of approximately 1 to 25 times the capacitance value of said parasitic capacitance.

10. A step attenuator having a reduced insertion loss at high frequencies, comprising:
    a printed circuit board having first and second mounting surfaces;
    a highpass filter network, including a high frequency circuit path mounted on the first surface of said printed circuit board and passing high frequency signals;
    a lowpass filter network, including an attenuator network mounted on the second surface of said printed circuit board and having input and output nodes, said lowpass filter network having a frequency response and presenting a high inductive reactance to high frequency signals at the input and the output nodes of the attenuator network;
    a parasitic capacitance through the printed circuit board, between the high frequency circuit path of said highpass filter network and the input and output nodes of the attenuator network, causing high frequency signals from the high frequency path to leak to the attenuator network;
    a first capacitive circuit, connected across the attenuator network between the input node and ground, consisting essentially of one or more capacitors and having a low reactance to the leaked high frequency signals, said first capacitive circuit having a capacitance value that does not substantially affect the frequency response of said lowpass filter network, said first capacitive circuit being coupled to said parasitic capacitance to draw at least some of the leaked signals away from the attenuator network and to substantially prevent their energy from being absorbed in the attenuator network; and
    a second capacitive circuit, connected across the attenuator network between the output node and ground, consisting essentially of one or more capacitors and having a low reactance to the leaked high frequency signals, said second capacitive circuit having a capacitance value that does not substantially affect the frequency response of said lowpass filter network, said second capacitive circuit being coupled to said parasitic capacitance to draw more of the leaked signals away from the attenuator network and to substantially prevent their energy from being absorbed in the attenuator network, whereby a reduction of the insertion loss of said step attenuator at high frequencies is achieved.

11. The step attenuator of claim 10, wherein said first capacitive circuit consists of a single capacitor, and wherein said second capacitive circuit consists of a single capacitor.

12. The step attenuator of claim 10, wherein said first capacitive circuit consists of a single capacitor having a capacitance value in the range of about 0.5 pF to about 11 pF, and wherein said second capacitive circuit consists of a single capacitor having a capacitance value in the range of about 0.5 pF to about 11 pF.

13. The step attenuator of claim 10, wherein said first and said second capacitive circuits each have a capacitance value in the range of about 0.5 pF to about 11 pF.

14. The step attenuator of claim 10, wherein the parasitic capacitance has a first capacitance value defined between the high frequency path and the input node of the attenuator network and a second capacitance value defined between the high frequency path and the output node of the attenuator network, and wherein said first capacitive circuit has a capacitance value of approximately 3 to 4 times the first capacitance value of the parasitic capacitance and said second capacitive circuit has a capacitance value of approximately 3 to 4 times the second capacitance value of the parasitic capacitance.

15. The step attenuator of claim 10, wherein the parasitic capacitance has a first capacitance value defined between the high frequency path and the input node of the attenuator network and a second capacitance value defined between the high frequency path and the output node of the attenuator network, and wherein said first capacitive circuit has a capacitance value of approximately 1 to 25 times the first capacitance value of the parasitic capacitance and said second capacitive circuit has a capacitance value of approximately 1 to 25 times the second capacitance value of the parasitic capacitance.

16. A method of reducing the insertion loss of a step attenuator at high frequencies, wherein said step attenuator comprises
a printed circuit board having first and second surfaces, a highpass filter network having a high frequency circuit path mounted on the first surface, and a lowpass filter network having an attenuator network mounted on the second surface, the high frequency circuit path passing high frequency signals, the attenuator network having input and output nodes, the lowpass filter network having a frequency response and presenting a high inductive reactance to high frequency signals at the input and the output nodes of the attenuator network, and wherein
a parasitic capacitance extends through the printed circuit board, between the high frequency circuit path of the highpass filter network and the input and output nodes of the attenuator network, causing high frequency signals from the high frequency path to leak to the attenuator network, said method comprising the steps of:
(a) connecting a capacitive circuit across the attenuator network between either the input or the output node and ground, the capacitive circuit having a low reactance to the leaked high frequency signals and a capacitance value that does not substantially affect the frequency response of the lowpass filter network; and
(b) coupling said capacitive circuit to the parasitic capacitance to draw at least some of the leaked signals away from the attenuator network and to substantially prevent their energy from being absorbed in the attenuator network,
whereby a reduction of the insertion loss of said step attenuator at high frequencies is achieved.

17. The method of claim 16, wherein step (a) consists of connecting one or more capacitors across the attenuator network, between either the input or the output node and ground.

18. The method of claim 16, wherein said capacitive circuit has a capacitance value in the range of about 0.5 pF to about 11 pF.

19. The method of claim 16, wherein said parasitic capacitance has a capacitance value defined between the high frequency circuit path of said highpass filter network and either the input or the output node of the attenuator network, and wherein said capacitive circuit has a capacitance value of about 3 to 4 times the capacitance value of said parasitic capacitance.

20. The method of claim 16, wherein said parasitic capacitance has a capacitance value defined between the high frequency circuit path of said highpass filter network and either the input or the output node of the attenuator network, and wherein said capacitive circuit has a capacitance value of about 1 to 25 times the capacitance value of said parasitic capacitance.

21. The method of claim 16, wherein step (a) includes connecting said capacitive circuit between the input node of the attenuator network and ground, said method further comprising the steps of:
(d) connecting a second capacitive circuit across the attenuator network between the output node and ground, the capacitive circuit having a low reactance to the leaked high frequency signals and a capacitance value that does not substantially affect the frequency response of the lowpass filter network; and
(e) coupling said second capacitive circuit to the parasitic capacitance to draw more of the leaked signals away from the attenuator network and to substantially prevent their energy from being absorbed in the attenuator network.

22. The method of claim 21, wherein step (a) consists of connecting one or more capacitors across the attenuator network between the input node and ground, and wherein step (d) consists of connecting one or more capacitors across the attenuator network between the output node and ground.

23. The method of claim 16, wherein step (a) consists of connecting a single capacitor across the attenuator network, between either the input or the output node and ground.

24. The method of claim 23, wherein the capacitor has a capacitance value in the range of about 0.5 pF to about 11 pF.

* * * * *

UNITED STATES PATENT AND TRADEMARK OFFICE
CERTIFICATE OF CORRECTION

| | | |
|---|---|---|
| PATENT NO. | : 8,022,785 B2 | Page 1 of 1 |
| APPLICATION NO. | : 12/315379 | |
| DATED | : September 20, 2011 | |
| INVENTOR(S) | : Martin L. Zelenz | |

It is certified that error appears in the above-identified patent and that said Letters Patent is hereby corrected as shown below:

Front Sheet of Patent --

(73) Assignee:

"Arcom Digital, LLC, Syracuse, NY" should read --Tresness Irrevocable Patent Trust, Syracuse, NY--.

Signed and Sealed this
Twentieth Day of December, 2011

David J. Kappos
*Director of the United States Patent and Trademark Office*